United States Patent
Bergmann et al.

(10) Patent No.: US 7,145,929 B2
(45) Date of Patent: Dec. 5, 2006

(54) DRIVER CIRCUIT AND METHOD FOR DRIVING AN ELECTRONIC COMPONENT

(75) Inventors: Guenther Bergmann, Blaustein (DE); Erwin Dotzauer, Roggenburg (DE); Holger Vogelmann, Uhingen (DE); Herbert Knotz, Erbach (DE); Wolfgang Wernig, Blaustein (DE)

(73) Assignee: Atmel Germany GmbH, Heilbronn (DE)

( * ) Notice: Subject to any disclaimer, the term of this patent is extended or adjusted under 35 U.S.C. 154(b) by 289 days.

(21) Appl. No.: 10/846,836

(22) Filed: May 13, 2004

(65) Prior Publication Data
US 2004/0257140 A1    Dec. 23, 2004

(30) Foreign Application Priority Data
May 14, 2003    (DE)    ................. 103 23 669

(51) Int. Cl.
*H01S 3/00*    (2006.01)
(52) U.S. Cl. ................. 372/38.02; 372/38.07; 372/38.08
(58) Field of Classification Search ............. 372/38.02, 372/38.03, 38.04, 38.07, 38.08
See application file for complete search history.

(56) References Cited

U.S. PATENT DOCUMENTS

| | | | |
|---|---|---|---|
| 5,177,451 A | | 1/1993 | Lehmann |
| 5,191,589 A | * | 3/1993 | Amano et al. ........... 372/38.02 |
| 5,701,133 A | | 12/1997 | Miller et al. |
| 5,736,844 A | | 4/1998 | Yanagisawa |
| 5,796,767 A | | 8/1998 | Aizawa |
| 6,389,050 B1 | | 5/2002 | Stronczer |
| 6,516,015 B1 | * | 2/2003 | Kimura ................... 372/38.02 |
| 6,735,228 B1 | * | 5/2004 | Tsai ........................ 372/38.02 |
| 2003/0151411 A1 | * | 8/2003 | Tucker ....................... 324/510 |
| 2004/0195981 A1 | | 10/2004 | Mizuno et al. |
| 2005/0002429 A1 | * | 1/2005 | Nakatani ................. 372/38.02 |

FOREIGN PATENT DOCUMENTS

| | | |
|---|---|---|
| EP | 0 707 255 | 4/1996 |
| EP | 0 756 362 | 1/1997 |
| EP | 0810700 | 12/1997 |
| JP | 04-239188 | 8/1992 |
| JP | 04-275473 | 10/1992 |
| JP | 05-259546 | 10/1993 |
| JP | 2001036187 | 2/2001 |
| WO | WO 03/034558 | 4/2003 |

OTHER PUBLICATIONS

Translation of JP 2001-03617 original published Feb. 9, 2001).*

* cited by examiner

*Primary Examiner*—James Menefee
(74) *Attorney, Agent, or Firm*—W. F. Fasse; W. G. Fasse

(57) ABSTRACT

A driver circuit and a method drive an electronic component such as a laser diode with a variable electric current that is controlledly switched between at least two discrete current levels. The driver circuit includes circuit elements that damp ringing or initial transient oscillations that arise when switching the current between the current levels. The driver circuit includes a current mirror having a mirror amplification factor dependent on the frequency of the variable electric current. In order to counteract parasitic capacitances and/or inductances leading to the ringing, an inductance and/or a resistance are connected between the two series circuits making up the current mirror, a capacitance is connected parallel to a reference resistor of one of the series circuits, and/or a capacitance is connected across the voltage supply.

18 Claims, 4 Drawing Sheets

DRIVER CIRCUIT AND METHOD FOR DRIVING AN ELECTRONIC COMPONENT

PRIORITY CLAIM

This application is based on and claims the priority under 35 U.S.C. §119 of German Patent Application 103 23 669.4, filed on May 14, 2003, the entire disclosure of which is incorporated herein by reference.

FIELD OF THE INVENTION

The invention relates to a driver circuit and a method of driving it, for driving an electronic component with a variable electric current that is controlled to switch between at least two discrete current levels.

BACKGROUND INFORMATION

Laser diodes represent an example of an electronic component that can be driven with such a driver circuit of the above-mentioned general type. A driver circuit of this type for driving laser diodes is known from the European Patent Publication EP 0,810,700 A2.

Semiconductor lasers based on laser diodes are used, for example, for recording or writing data into storage media such as CDs and DVDs. Such writing of data takes place at a high speed and thus requires the laser device to provide optical light pulses with precisely defined on and off times and time durations, as well as a precise power. For achieving this precisely defined optical output power of the light, it is therefore necessary to use activating or control circuits that provide current pulses having a defined magnitude and a precise time behavior.

In the generation of such current pulses, there is the general problem that transient oscillations or so-called ringing processes arise when controlledly switching the driver voltage and/or the driver current from a first level to a second level. These transient oscillations or ringing processes are undesirable and have undesirable consequences. The magnitude of the deviations from the ideal voltage or current curve that arise in connection with the ringing processes depend on the quality of the oscillating or resonant circuit that is being excited. In the above mentioned European Patent Publication EP 0,810,700 A2, the quality of the oscillating circuit is reduced by the parallel circuit connection of R-C components. This approach is problematic, however, because it sharply reduces the rise rate and/or the fall-off rate of the current. A further disadvantage is that the unavoidable housing and bond capacitances nonetheless remain effective and thus reduce the efficacy of the suggested measures for reducing the oscillating circuit quality. Moreover, actually carrying out the proposed measures requires a considerable chip surface area when fabricating the driver circuit as an integrated circuit.

SUMMARY OF THE INVENTION

In view of the above, it is an object of the invention to provide a driver circuit of the above mentioned general type that achieves reduced transient oscillations or ringing processes when switching between two output levels. Another object of the invention is to provide a method for operating such a driver circuit to reduce the ringing processes. The invention further aims to avoid or overcome the disadvantage of the prior art, and to achieve additional advantages, as apparent from the present specification.

The above objects have been achieved according to the invention in a driver circuit for driving an electronic component with a variable electric current, which is controlled to switch between at least two discrete current levels. The driver circuit comprises circuit elements that damp transient oscillations or ringing processes that arise when the variable electric current is switched between the at least two discrete current levels. Particularly according to the invention, the driver circuit comprises a current mirror circuit having a mirror factor that is dependent on the frequency of the variable electric current. In the associated method according to the invention, the driver circuit switches the variable electric current between at least two discrete current levels, whereby transient oscillations or ringing processes arise. The mirror factor of the current mirror circuit of the driver circuit varies dependent on the frequency of the variable electric current, in such a manner so as to reduce or damp the ringing processes that arise when switching between the current levels.

It has been achieved and demonstrated according to the invention, that the frequency-dependent realization of the mirror factor of a current mirror, in sum, leads to reduced transient oscillations or ringing processes when switching between current levels. According to the invention with the frequency-dependent mirror factor, it is possible to drive and activate electronic components, and especially laser diodes for example, with current pulses of high amplitude up to a few hundred mA, with short rise times and fall-off times in the range of less than one nanosecond, with reduced initial transient oscillations or ringing processes when switching between the discrete current levels.

It is preferred according to the invention, that the current mirror circuit comprises a first series circuit of a reference resistor and a reference transistor connected between a first supply voltage input connection and an output (or current-drawing input) of a control current source. Furthermore, the preferred current mirror circuit comprises a second series circuit of a further resistor and a further transistor connected between a second supply voltage connection and an output of the current mirror circuit through which the electronic component is driven or activated with the controlled variable electric current. In that context, both the reference transistor as well as the further transistor are controlled in common by the control current source.

It is a significant advantage of this current mirror circuit, that it can be monolithically integrated. A further advantage is that a mirror factor K(f) dependent on the frequency (f) can be realized by circuit-technical measures that reduce an effective collector-base capacitance of the transistors and that are monolithically integratable without requiring a large chip surface area.

It is further preferred according to the invention, that the current mirror circuit comprises a capacitance or capacitor that bridges over the reference resistor, i.e. is connected across and in parallel with the reference resistor. Further, it is preferred that the current mirror circuit comprises an inductance or inductor that is circuit-connected in series with the further resistor. These two measures, both individually and in combination, represent simple means for achieving a frequency-dependent mirror factor K(f) with simple circuit elements. These measures each substantially reduce the effective collector-base capacitance of the driver circuit. By inserting the inductance into the circuit and/or by connecting the capacitance in parallel as described herein, it is achieved that the displacement current of the effective collector-base capacitance of the driver circuit is amplified only by a mirror factor K(f) that falls-off over the frequency.

The displacement current essentially flows through the reference transistor and the reference resistor out to the supply voltage. This measure reduces the effective collector-base capacitance of the driver circuit, which fundamentally leads to an increase of the steepness or slope of the current flanks. However, opposed to this effect is the fact that the frequency-variable mirror factor will reduce the steepness or slope of the flanks. As a sum total of the two opposed effects, the result achieves a drastic reduction of the initial transient oscillations or ringing process with only a slight reduction of the steepness or slope of the current flanks, especially through the inventive circuit-connection of the inductance.

It should be understood throughout this specification, that the respective pairs of terms, "capacitance" and "capacitor", "resistance" and "resistor", and "inductance" and "inductor", are used interchangeably unless such interchangeability is excluded by the context. Namely, while the terms such as "capacitance" generally refer to the concept or value of a capacitance, and the terms such as "capacitor" generally refer to a physical circuit element that embodies or achieves a capacitance, it should also be understood that a "capacitance" can refer to a physical circuit element that provides a capacitance, depending on the context of the particular sentence. Also, a "capacitance" or a "capacitor" can refer to a single capacitive circuit element or plural capacitive circuit elements connected together to provide an overall capacitance value. Of course, the term "capacitance" also refers to or covers the inherent or parasitic capacitance of circuit elements other than purposely provided capacitors. Similar considerations apply to the other terms such as resistance/resistor, inductance/inductor, etc.

A further advantage of the inventive circuit and method when used for driving a laser diode is that the voltage drop arising across the laser diode, due to the high variation rate of the laser diode current, is no longer coupled into the supply voltage of the driver component. Thus, undesired influences of the control or activating circuit are reduced or even entirely avoided.

A further preferred embodiment of the invention involves realizing the overall capacitance by means of plural individual capacitances or capacitors. It has been demonstrated that this embodiment contributes to optimizing the initial transient oscillation behavior, whereby the inductance is maintained.

It is also preferred that the inductance is realized by the intervening connection of a conductive bond or connection between the first supply voltage connection and the second supply voltage connection. Particularly, it is preferred that this conductive connection is realized by a bond wire. In an alternative further preferred embodiment, the conductive connection is realized by a conductive strip or trace on a printed circuit board or the like that carries the current mirror circuit.

According to further preferred features of the invention, the reference transistor and the further transistor are embodied as bipolar pnp-transistors or p-channel field effect transistors. An alternative preferred embodiment is characterized in that the reference transistor and the further transistor are embodied as bipolar npn-transistors or n-channel field effect transistors. These embodiments all achieve the advantage that they can be readily integrated into a monolithic integrated circuit, without leading to considerable increases in the total required chip surface area.

Still further it is preferred that an n-well of a pnp-transistor or a p-well of an npn-transistor is connected via a damping resistor to a reference potential. Thereby, it is achieved that the displacement current flowing through the capacitance of the associated pn-junction can flow away directly to the supply voltage. As a result, the n- or p-layer, which is often embodied as a well, is held to a constant potential. In this manner, undesired displacement currents, which can arise due to the relatively large capacitance between the well and the substrate, are suppressed or held to a small value. In that context, the resistor achieves a reduction of the quality of the resonant or oscillating circuit that arises in connection with the inductance of the conductor lines leading to the electronic component, for example, the laser diode. Finally, this measure or feature also leads to a reduction of the initial transient oscillations or ringing processes.

Further advantages of the invention are evident from the remainder of the specification and the accompanying drawings. It should be understood that the several features of the invention disclosed herein are not limited to the particular combinations as described or illustrated, but rather can be used individually or in other combinations as well, while still remaining within the scope of the present invention.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF A PREFERRED EXAMPLE EMBODIMENT AND OF THE BEST MODE OF THE INVENTION

Figure 1:
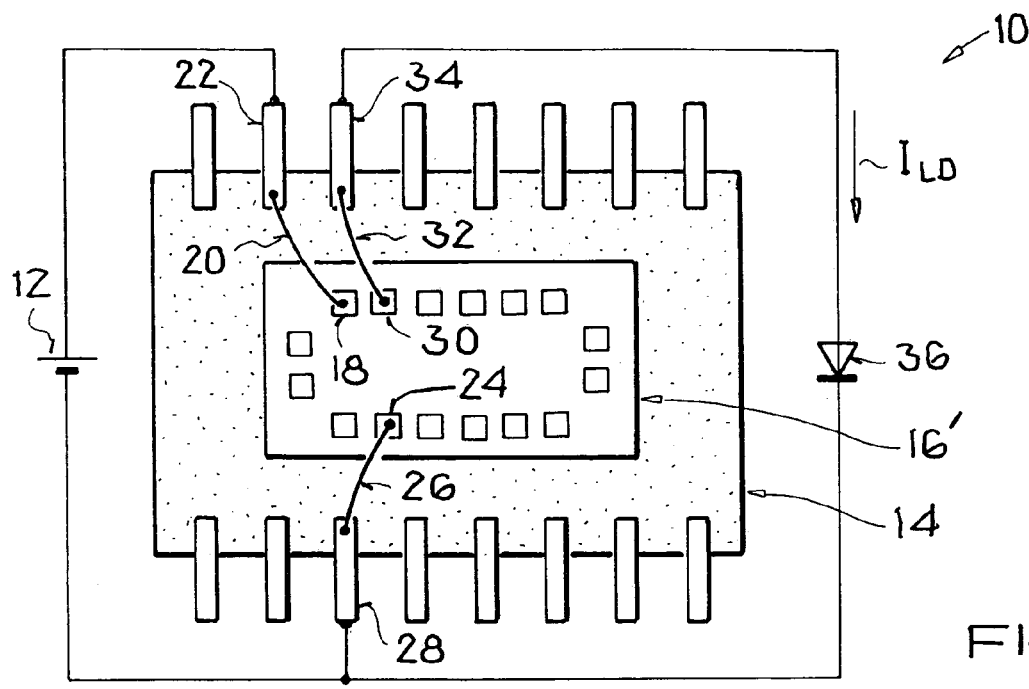
FIG. 1 is a schematic plan view of a typical technical field of application of the invention, with regard to a circuit arrangement with a supply voltage source, a driver circuit, and a laser diode.

FIG. 1 generally and schematically shows a circuit 10 representing an application of a driver circuit for a laser diode 36. The circuit 10 comprises a supply voltage source 12, which supplies electrical power (voltage and/or current) to a driver component 14 including a driver chip 16'. The driver chip 16' comprises at least a first supply voltage input connection or terminal 18, which is connected via a bond wire 20 with a connection pin 22 on the driver component 14. Furthermore, the driver chip 16' comprises at least one ground connection or terminal 24, which is connected via a bond wire 26 with a ground connection pin 28 on the driver component 14. The two connection pins 22 and 28 are connected with various outputs of the supply voltage source 12, so that an appropriate supply voltage is applied to the driver chip 16' via its supply voltage input terminal 18 and its ground terminal 24. Namely, this supply voltage is provided by the supply voltage source 12 to the driver chip 16'.

Furthermore, the driver chip 16' comprises at least one control signal output 30 that is connected via a bond wire 32 with an output connection pin 34 of the driver component 14. An electronic component 36, for example a laser diode 36, is circuit-connected between the output connection pin 34 and the ground connection pin 28 of the driver component 14. Thus, the laser diode 36 is driven or activated with a driving current I_LD via the control signal output 30 of the driver chip 16'. In this context, the circuit 10 is able to provide a driving current I_LD in the range from 0 to a few hundred 100 mA to the laser diode 36. The information determining which current level is to be provided at which time (e.g. dependent on a data signal) is conveyed to the driver chip 16' from an external source via further connections of the driver component 14, or is generated internally in the driver component 14 itself.

Figure 2:
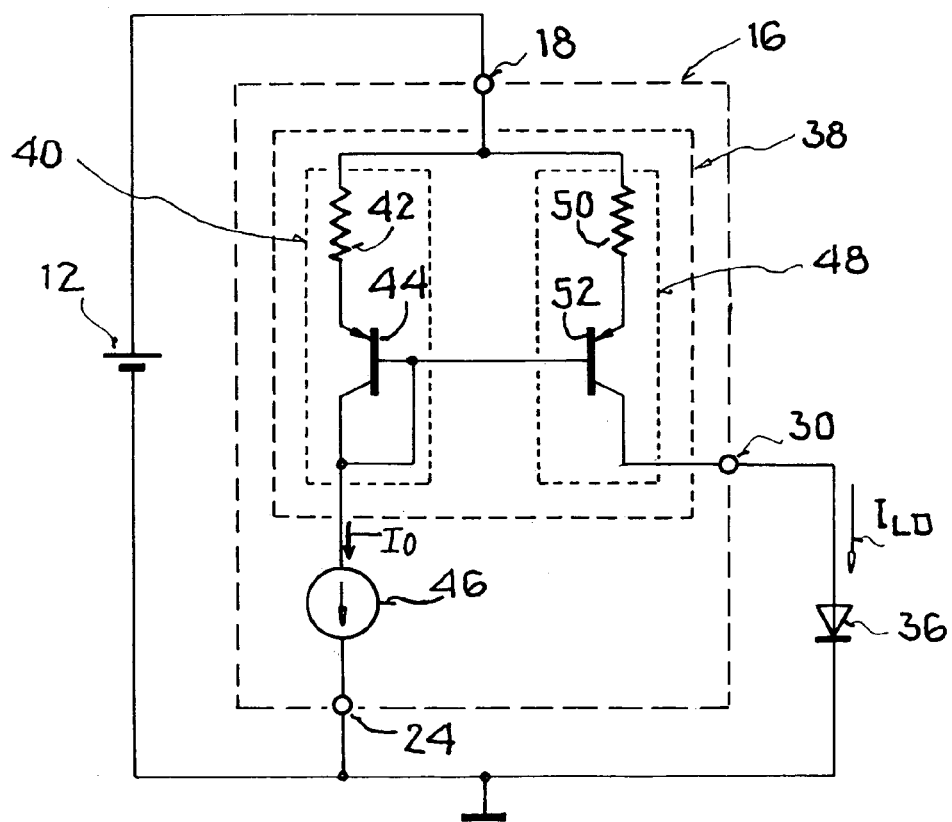
FIG. 2 is an idealized simplified block circuit diagram of a driver circuit with a current mirror circuit that does not have a frequency-dependent mirror factor.

FIG. 2 shows an electrical block circuit diagram representing the application circuit of FIG. 1, whereby the circuit 10 comprises a driver circuit 16, which includes a current mirror circuit or current mirror 38. Thereby, the electrical driver circuit 16 is physically embodied and integrated in the driver chip 16', which is mounted on the driver component 14 as described above. In general, current controlled current sources with sign reversal are designated as current mirrors.

The current mirror 38 according to FIG. 2 comprises a first series circuit 40 of a reference resistor 42 and a reference transistor 44 that is circuit-connected in the manner of a transistor diode. The first series circuit 40 is circuit-connected between the supply voltage input 18 and a control current source 46, which controls the current mirror 38 and therewith the laser diode 36 that is connected to the control signal output 30 of the driver circuit 16.

The current mirror 38 of the driver circuit 16 further includes a second series circuit 48 of a further resistor 50 and a further transistor 52, connected between the supply voltage input 18 and the control signal output 30 of the driver circuit 16. Control terminals (i.e. bases) of both the reference transistor 44 and the further transistor 52 are connected in common to the control current source 46. Thereby, the control current source 46 controls both the reference transistor 44 as well as the further transistor 52, due to the current mirror arrangement of the two series circuits 40 and 48, with the common connection of the bases of two transistors 44 and 52 to each other and to the current source 46.

The driving current I_LD required for driving or activating the laser diode 36 is provided and controlled through the further transistor 52, which thus serves as the driver transistor, and forms the current mirror circuit 38 in connection with the reference transistor 44. The particular purpose or object of the current mirror circuit 38 is to amplify the control current I0 of the current source 46 by a factor K that is defined as exactly as possible. In order to achieve this, the following conditions must be satisfied.

First of all, the quotient of the emitter area of the further transistor 52 and the emitter area of the reference transistor 44 connected as a transistor diode must give the factor K. Furthermore, the ratio of the resistances 42 and 50 must similarly correspond to the factor K. In that regard the two resistors 42 and 50 achieve a uniform proportional current distribution in the transistors 44 and 52 realized respectively by several emitter fingers. Moreover, the further resistor 50 achieves a reduction of the so-called early effect that leads to an undesired dependence of the output driving current I_LD on the collector-emitter voltage of the transistors 44 and 52.

The value of the factor K is thus determined and set by the selection of the transistors and resistors being used, and thus through the design and layout of the driver circuit 16, which is realized as an integrated circuit. In this context, the value of the factor K is formed or determined as a compromise among the requirements for the control current I0, the requirements for the dynamic characteristics of the driver circuit 16, and the requirements of the accuracy of the transmission ratio or amplification represented by the factor K. Generally, the value of the factor K for applications using bipolar transistor technology lies in the range of values from 4 to 20.

The remaining circuit portion of the driver circuit 16, i.e. the driver chip 16', is represented by the control current source 46, mentioned above. The control current source 46 can be embodied in any conventionally known manner of a current source, and does not need to be described in further detail here for a proper understanding of the invention.

Figure 3:
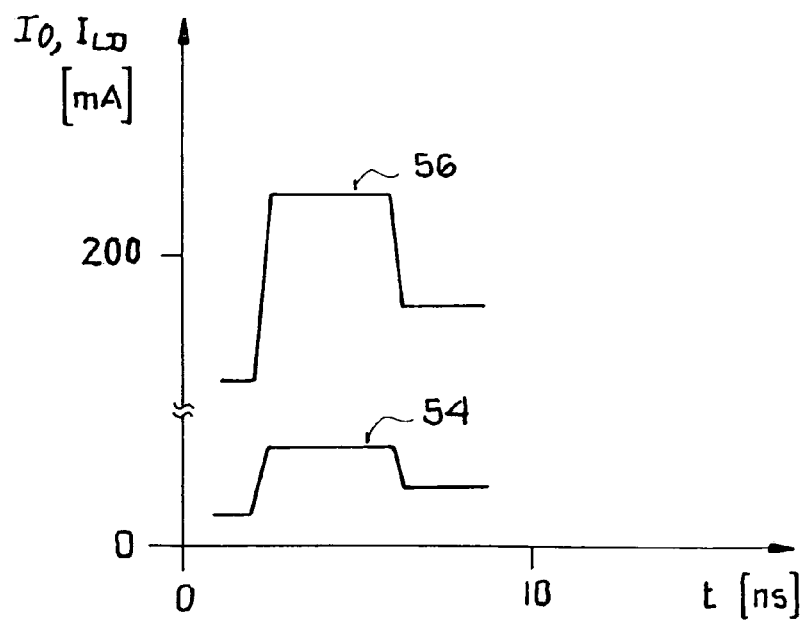
FIG. 3 is a current versus time diagram showing the time curve or characteristic of an internal control current signal and of an ideal output signal of the driver circuit according to FIG. 2.

With reference to FIG. 3, the characteristic or behavior over time, of an internal control current signal I0 and of an ideal output signal I_LD of the driver circuit 16 according to FIG. 2 will now be described in connection with respective current-time curves. Particularly, the current-time curve 54 represents the time behavior or progression of the control current I0, as it is output by (e.g. drawn by) the control current source 46 in FIG. 2. On the other hand, the current-time curve 56 represents the time behavior or progression of the idealized driving current I_LD, which is ideally given by the control current I0 amplified by the factor K, and which is ideally to be output by the driver circuit 16. Such an ideal behavior is achieved if the rise rate of the current is so small that the voltage drop U_L across the unavoidable inductances, which arises according to the relationship $U\_L = L \cdot dI/dt$, is sufficiently small (i.e. negligibly small). For analogous reasons, the displacement current I_C on the unavoidable capacitances of the driver circuit 16, which displacement current arises in connection with a voltage variation U_C across the capacitances, should be sufficiently small (i.e. negligibly small). As is known, the displacement current I_C is given by the relationship $I\_C = C \cdot dU\_C/dt$.

The above described conditions, however, are not satisfied in connection with a variation of the current strength to various levels, as arises in the current for driving a laser diode in connection with writing data to CDs or DVDs. In real (non-ideal) circuits, initial transient oscillations or ringing processes arise in connection with the current variations when switching between the specified current levels. In this regard, the solid lines depicting the current-time curve 56 in FIG. 4 correspond to the ideal curve 56 shown in FIG. 3, i.e. representing the desired or ideal time behavior of the output signal of the driver circuit 16. However, due to the above mentioned inductances and capacitances that cannot be avoided, overshooting oscillations 58 and 64 as well as undershooting oscillations 60 and 62 are superimposed on the ideal current behavior or curve 56. These overshooting and undershooting transient oscillations 58, 60, 62, 64 or ringing processes that arise when switching to each new current level detract from the accuracy of the control of the electronic component 36, for example the laser diode that emits a laser beam for writing data to CDs or DVDs. The result is a reduction of the accuracy or precision of the writing of the data.

The interfering inductances exist both in the driver component 14 in the form of bond wire inductances and housing inductances, as well as externally in the conductive supply lines for the supply voltage and for the current supply to the laser diode 36. These inductances cannot be completely eliminated using today's modern circuit fabrication techniques. For example, values of the bond wire inductances are typically in a range of about 1 nH. Values of a few nH are typical for the conductor lines connected to the laser diode 36. As mentioned above, the supply or connection of the supply voltage to the driver component 14, and to the driver chip 16' on the component 14, are further subject to unavoidable inductances.

Similarly inherent or parasitic capacitances are unavoidably formed in the circuit arrangement 10 as well. In this context, the capacitances are primarily formed by the further transistor 52 operating as the driver transistor in the driver circuit 16. Additional capacitances arise as conductor line capacitances, for example capacitances of the conductor paths for connecting the laser diode 36 to the circuit 10.

Figure 4:
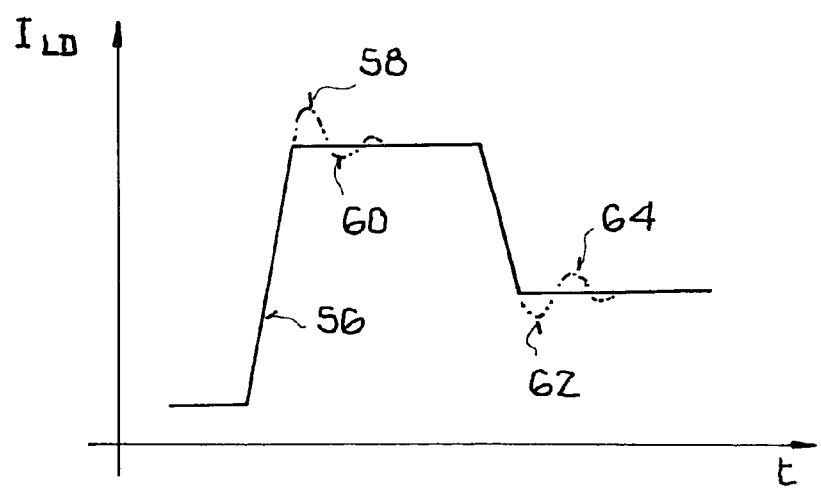
FIG. 4 is a current versus time diagram showing examples of ideal and real time curves of activating or driving signals.

The above mentioned inductances and capacitances of the circuit 10, form resonant or oscillating circuits that lead to the initial transient oscillations or ringing processes including overshooting oscillations 58 and 64 and undershooting oscillations 60 and 62 as illustrated and discussed above in connection with FIG. 4. The self-resonant frequencies of the oscillating circuits in this context are generally different or variable, so that different forms of the current behavior can arise through the super-position of various self-resonant frequencies of various different oscillating circuits. In that regard, the height or magnitude of the deviations of the actual current behavior, e.g. the magnitude of the deviations represented by the initial transient oscillations 58, 60, 62, 64 as shown in FIG. 4, relative to the ideal current behavior of curve 56, depends on the quality of the oscillating circuit being excited.

Figure 5:
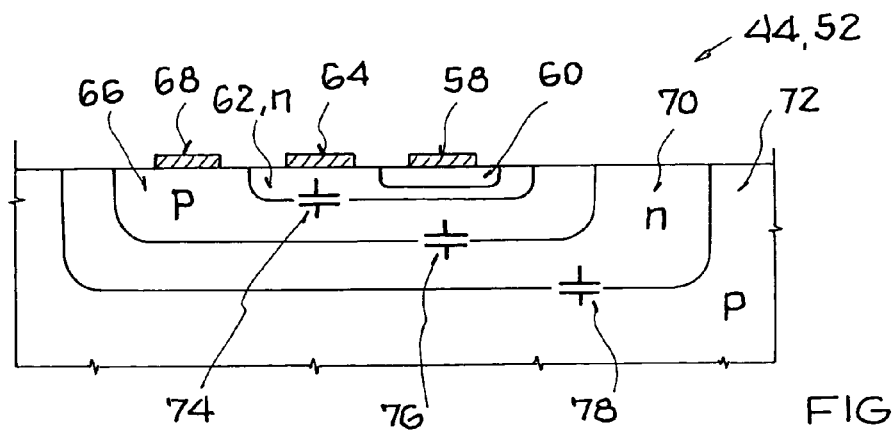
FIG. 5 shows a cross-section through a monolithic integrated transistor of the driver circuit according to FIG. 2.

FIG. 5 schematically represents a cross-section through a monolithic integrated transistor 44 or 52 of the driver circuit 16 according to FIG. 2. The illustrated transistor is a bi-polar pnp-transistor with a metallic emitter contact 58 on a p-doped emitter layer 60. The layer 60 is embedded in an n-doped base layer 62, which is contacted by a metallic base contact 64. In turn, the base layer 62 lies in a p-doped collector layer 66, which is contacted by a metallic collector contact 68. The above described overall layered structure is embedded in an insulating n-doped well 70, which in turn lies in a p-conductive substrate 72.

In or between the layers in which the charge carrier concentration transitions from a first concentration to a second concentration, unavoidable parasitic capacitances 74, 76 are necessarily formed in the illustrated pnp-transistor. For example, the transistor necessarily includes an unavoidable collector-base capacitance 74 between the collector layer 66 and the base layer 62, an unavoidable capacitance 76 between the collector layer 66 and the n-well 70, and an unavoidable capacitance 78 between the n-well 70 and the p-substrate 72.

In order to achieve an advantageous (minimized) initial transient oscillation or ringing behavior, both the parasitic inductances as well as the parasitic capacitances described above are to be minimized or reduced to the extent possible. For a given device fabrication technology and for given current levels necessary for driving the given electronic component 36, the parasitic capacitances 74, 76 and 78 illustrated in FIG. 5 cannot be further reduced. However, the influence of such capacitances on the ringing behavior of the output current can be affected, e.g. minimized, by suitable circuit measures. This is especially true for the collector-base capacitance 74.

Figure 6:
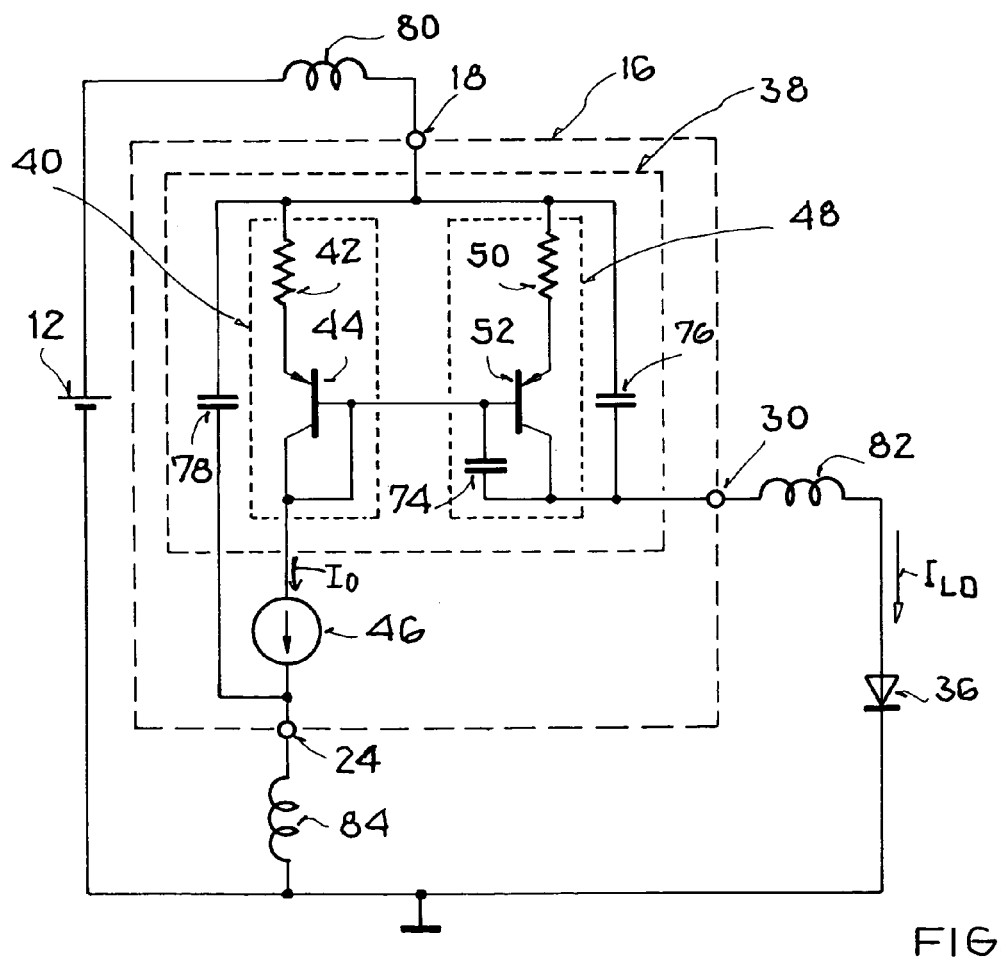
FIG. 6 is a schematic block circuit diagram of a real driver circuit with capacitances and inductances necessitated by or inherent in the components.

FIG. 6 shows the circuit arrangement according to FIG. 2, further supplemented with the inherent conductor line inductances and transistor capacitances that arise in an actual or real embodiment of the circuit. For example, that involves especially the inductance 80 of the supply line between the supply voltage source 12 and the supply voltage input 18, the inductance 82 of the control line between the control signal output 30 of the driver circuit 16 and the laser diode 36 that is to be driven thereby, as well as the inductance 84 of the ground connection 24 of the driver circuit 16. The collector-base capacitance 74 is especially significant in the further transistor 52, i.e. the driver transistor, so it is shown in FIG. 6 between the control input or base and the collector of the further transistor 52. The collector-well capacitance 76 lies parallel to the second series circuit 48 of the resistor 50 and the further transistor 52 in the circuit diagram of FIG. 6. The well-substrate capacitance 78 lies between the supply input 18 and the ground connection 24 in the circuit diagram of FIG. 6.

Figure 7:
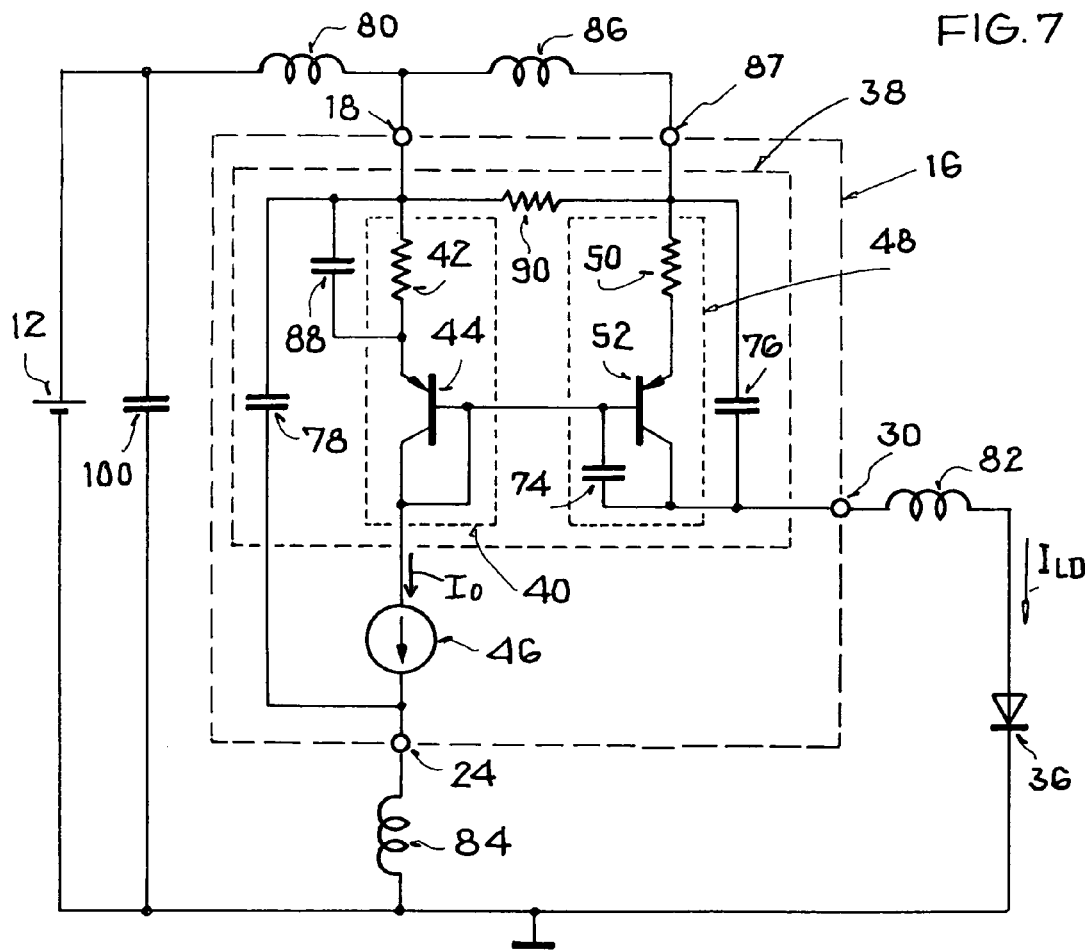
FIG. 7 is a schematic block circuit diagram of a real driver circuit as an example embodiment of the invention.

Referring now to FIG. 7, circuit technical measures according to the invention for influencing the initial transient oscillation or ringing behavior in a desired manner will now be described. Particularly, these measures according to the invention give rise to a frequency-dependent amplification factor K of the current mirror circuit 38. Through the inventive realization of a frequency-dependent mirror factor (or amplification factor) K(f), the effective collector-base capacitance 74 can be substantially reduced or counteracted.

With regard to the example embodiment of the inventive arrangement according to FIG. 7, this is achieved by connecting the inductance 86 between the supply line inductance 80 and the second series circuit 48 of the further resistor 50 and the further transistor (i.e. driver transistor) 52. The inductance 86 can be connected externally to the driver circuit 16, i.e. the inductance 86 is connected between the first supply voltage input 18 and a second supply voltage input 87 of the driver circuit 16. In this manner, the inductance 86 may, for example, be realized as a bond wire connected between the input terminals 18 and 87.

As an alternative or a supplement to the above mentioned insertion of the inductance 86, a capacitance 88 can be connected across and parallel to the reference resistor 42. Thereby, the displacement current of the collector-base capacitance 74 is amplified only by the mirror factor K(f) that falls-off over the frequency. In other words, this arrangement makes use of the fact that the effect of the collector-base capacitance 74 is scaled with the mirror ratio K(f). This can still further be understood in that, with the special circuit connection according to FIG. 7, the effective capacitance of the collector-base junction is proportional to the collector-base capacitance 74. The displacement current allocated to this collector-base capacitance 74 thus flows away essentially through the reference transistor 44 and the reference resistor 42 to the supply voltage. As has already been mentioned above, this measure reduces the effective collector-base capacitance 74 and thus fundamentally leads to an increase of the slope or steepness of the current flanks of the current level transitions of the current output, e.g. in FIG. 4. On the other hand, the steepness of the current flanks is reduced by the frequency-variable amplification factor K.

In sum, the insertion of the inductance 86 and/or the insertion of the capacitance 88 into the circuit as described above in connection with FIG. 7 leads to a drastic reduction of the initial transient oscillation or ringing behavior with only a slight reduction of the steepness of the current flanks. A further advantage is that the voltage drop arising on the laser diode 36 due to the high current variation rate of the laser diode current I_LD is no longer coupled into the supply voltage of the driver component 14. Thus, undesired influences of the controlling or driving circuit due to the above mentioned voltage drop are thereby avoided.

FIG. 7 further shows that the collector-well capacitance 76, i.e. more particularly the n-well 70 necessary for insulating the transistors, is connected via a resistor 90 to the supply voltage input 18. In other words, the resistor 90 is provided in the driver circuit 16 between the two supply voltage inputs 18 and 87. As a result, the displacement current flowing via the collector-well capacitance 76 can flow away directly to the supply voltage. Thereby it is especially achieved that the n-well 70 (FIG. 5) is held at a constant potential. Undesirable displacement currents, which could otherwise arise as a result of the relatively large capacitance 78 between the well 70 and the substrate 72, are thus held small. In this regard, the resistor or resistance 90 has the function of reducing the quality of the oscillating circuit arising in connection with the inductance 82 of the driving or activating line, which in turn holds the amplitude of the initial transient oscillations or ringing to a small value.

The additional supporting capacitor 100 shown in FIG. 7 reduces the influence of the bond wire inductances 80 in the supply line of the supply voltage for the driver chip 16' embodying the driver circuit 16.

Figure 8:
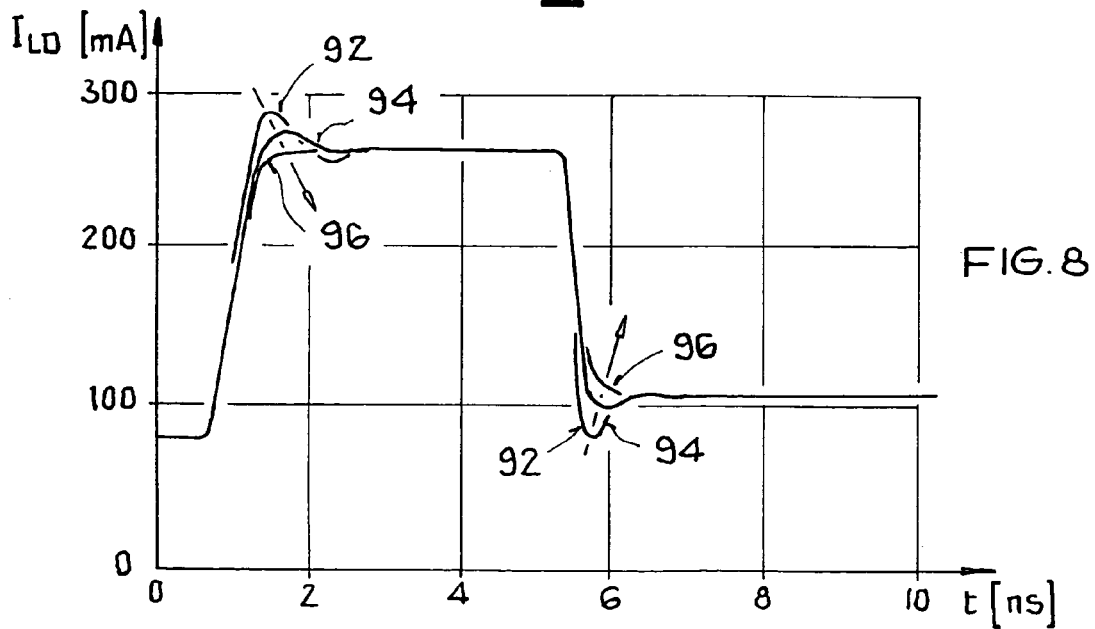
FIG. 8 is a current versus time diagram showing calculated time curves of the output signals of the driver circuits according to FIG. 6 and FIG. 7 respectively.

FIG. 8 is a current-time diagram showing the time course or behavior of the driving current I_LD for the laser diode 36, as calculated for various different values of the inductance 86. The curve 92 represents the current arising without any inductance 86. The curve 94 represents the current calculated for a value of 300 pH of the inductance 86 in connection with an inductance 82 of 3 nH in the driving line. As can be seen in FIG. 8 by comparing the curves 92 and 94, the connection of such an inductance 86 of 300 pH to the driver circuit 16 reduces the amplitude of the initial transient oscillation or ringing. A further reduction of the ringing amplitude is achieved by connecting an inductance 86 with a value of 600 pH, which results in the current course represented by the curve 96. As is evident from the course of the curve 96, the initial transient oscillations or ringing can be essentially completely eliminated while maintaining almost the same current flank slope of the current rise and current fall-off flanks.

Similar results as shown in FIG. 8 are obtained by connecting a capacitance 88 in the manner illustrated in FIG. 7. Also, similar results are achieved by providing a combination of a capacitance 88 with an inductance 86 for the driver circuit 16. Finally, it should be mentioned that the dimensioning of the circuit and its components, and therewith especially the dimensioning of the capacitance 88 and/or the inductance 86 is dependent on the technical boundary conditions such as, for example, the bond wire length, the inductance of the load (i.e. the laser diode 36), as well as the requirements for the rise time and the fall-off time of the driving or activating signal.

The above discussion relates to a circuit with a grounded laser diode 36, which requires a current mirror circuit 38 made of pnp-transistors 44 and 52. It should be understood, however, that the principle of the invention applies just as well to current mirror circuits made up of npn-transistors. In that case, the laser diode 36 would be connected to a positive reference voltage instead of ground. Analogously, the invention can also be carried out in connection with circuits embodied with CMOS technology (NMOS OR PMOS) for the transistors.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A driver circuit arrangement for driving an electronic component with a variable electric current which is controlled to switch between at least two different discrete current levels whereby transient oscillations arise when switching to each one of the current levels, said driver circuit arrangement comprising:
   a current mirror circuit adapted to produce said a variable electric current, having at least one input adapted to be connected to a power supply, having an output at which said variable electric current is provided for the electronic component, and having a mirror factor dependent on a frequency of said variable electric current; and
   at least one circuit element, internal or external to said current mirror circuit, that is arranged and adapted to damp said transient oscillations.

2. The driver circuit arrangement according to claim 1, further comprising a control current source;
   wherein said at least one input includes first and second supply voltage inputs adapted to be connected to a voltage supply as said power supply;
   wherein said current mirror circuit comprises:
   a first series circuit including a reference resistor and a reference transistor connected in series between said first supply voltage input and said control current source; and
   a second series circuit including a further resistor and a further transistor connected in series between said second supply voltage input and said output; and
   wherein respective control terminals of said reference transistor and said further transistor are connected in common to said control current source so as to be controlled thereby.

3. The driver circuit arrangement according to claim 2, wherein said at least one circuit element includes a capacitance (88) connected across and parallel to said reference resistor.

4. The driver circuit arrangement according to claim 3, wherein said capacitance comprises plural individual capacitors.

5. The driver circuit arrangement according to claim 3, wherein said at least one circuit element further includes an inductance (86) connected in series with said further resistor.

6. The driver circuit arrangement according to claim 2, wherein said at least one circuit element includes an inductance (86) connected in series with said further resistor.

7. The driver circuit arrangement according to claim 6, wherein said inductance is provided by a conductive connection interconnected between said first and second supply voltage inputs.

8. The driver circuit arrangement according to claim 7, wherein said conductive connection is a bond wire.

9. The driver circuit arrangement according to claim 7, further comprising a printed circuit board on which said current mirror circuit is arranged and carried, and wherein said conductive connection is a conductive strip conductor on said printed circuit board.

10. The driver circuit arrangement according to claim 2, wherein said reference transistor and said further transistor each respectively comprise a bipolar pnp-transistor or a p-channel field effect transistor.

11. The driver circuit arrangement according to claim 10, wherein said at least one circuit element includes a damping resistor (90) connected between an n-well of said pnp-transistor and a reference potential.

12. The driver circuit arrangement according to claim 2, wherein said reference transistor and said further transistor each respectively comprise a bipolar npn-transistor or an n-channel field effect transistor.

13. The driver circuit arrangement according to claim 12, wherein said at least one circuit element includes a damping resistor (90) connected between a p-well of said npn-transistor and a reference potential.

14. The driver circuit arrangement according to claim 2, wherein said control current source is further connected to a reference terminal of said driver circuit arrangement, and said at least one circuit element further includes a capacitance (100) connected between said at least one input and said reference terminal.

15. A method of operating said driver circuit arrangement according to claim 1, for driving said electronic component comprising a laser diode, wherein said method comprises:
   a) through said further transistor, selectively providing a driving current via said output to said laser diode;
   b) by means of said control current source, controlling said reference transistor and said further transistor to switch said driving current as said variable electric current between said different discrete current levels, whereby said transient oscillations arise due to oscillation in said driver circuit arrangement;
   c) reducing a resonant quality of said driver circuit arrangement with said at least one circuit element; and
   d) varying said mirror factor of said current mirror circuit dependent on and in response to a frequency of said variable electric current.

16. A driver circuit arrangement for driving an electronic component with a driving current that is controlledly switched between at least two current levels, comprising:
   a first circuit branch including a first resistor, a first transistor, and a current source connected in series between a first voltage input terminal and a reference terminal; and
   a second circuit branch including a second resistor and a second transistor connected in series between a second voltage input terminal and an output terminal adapted to provide said driving current to said electronic component;
   wherein respective control terminals of said first and second transistors are connected in common to said current source; and
   wherein said driver circuit arrangement further comprises at least one circuit element selected from the group consisting of a capacitance connected across and parallel to said first resistor, an inductance connected between said first and second voltage input terminals, a resistance connected between said first and second voltage input terminals, and a capacitance connected between said first and second voltage input terminals and said reference terminal.

17. The driver circuit arrangement according to claim 16, wherein said at least one circuit element comprises at least one of said capacitance connected across and parallel to said first resistor and said inductance connected between said first and second voltage input terminals.

18. An optical data writing arrangement comprising said driver circuit arrangement according to claim 16 and said electronic component being a laser diode connected between said output terminal and said reference terminal.

* * * * *